Oct. 10, 1950 H. A. MOORE 2,525,706

HIGH-FREQUENCY VERNIER TUNING CONDENSER

Filed May 6, 1948

INVENTOR
HAROLD A. MOORE
BY Harry Tunick
ATTORNEY

Patented Oct. 10, 1950 2,525,706

UNITED STATES PATENT OFFICE 2,525,706

HIGH-FREQUENCY VERNIER TUNING CONDENSER

Harold A. Moore, Riverhead, N. Y., assignor to Radio Corporation of America, a corporation of Delaware Application May 6, 1948, Serial No. 25,323

3 Claims. (Cl. 175—41.5)

This invention relates to a new and useful high frequency tuning condenser.

An object of this invention is to provide an improved type of vernier tuning condenser which is particularly adapted for use in high frequency circuits.

A feature of this invention is the vernier type of air tuning condenser which eliminates variable electric contacts, increases dial spread, and offers a special type of shaft shielding found to be quite necessary under certain operating conditions, and which is capable of changes in active capacitive areas and capacitive ranges.

This invention is specifically directed to a novel improved type of variable air condenser which is primarily adapted to function as a vernier condenser but may also be suitable for other applications where very small capacity ranges are required.

It has been found that prior art types of vernier condensers (particularly of the air padding varieties) are inclined to be noisy or intermittent when used in connection with high frequency oscillator circuits. My invention overcomes these objections.

In order that the mechanical action of the vernier condenser be smooth and not jumpy during the tuning operations, the condenser bearings must be relatively loose and free. This in turn causes poor electrical contacts to exist between condenser components, as well as the possibility of mechanical instability, either of which will cause a frequency instability of the oscillator. The above is particularly true of the more conventional and cheaper grades of vernier condensers.

The object of my invention is to provide a variable condenser unit which will overcome these objections and still be relatively low in cost. My invention overcomes these objections by:

First, eliminating the wiping contact usually associated with variable air condensers by using a spring type variable plate, one end of which is fastened solidly to the frame of the condenser.

Second, using a shaft bearing that is longer than commonly used and of such a design as to have freedom of rotation and a minimum of axial end play.

Third, spreading the tuning range over a greater dial travel; or, in other words, making the effective dial travel approach 360° instead of 180°, as is characteristic with a semi-circular plate air condenser.

Fourth, in cases where the condenser shaft must be long and in the presence of the oscillator field, by supplying the unit with an extended shaft bearing in such a manner as to support the knob end of the shaft and at the same time offer a thorough high frequency shield to the condenser shaft. If the shaft is in the presence of an oscillator field, and the knob end of the shaft is supported on a metallic bearing, and the bearing mounted in such a way as to cause a loop to be formed in which the condenser shaft and the bearing are a part thereof, oscillator instability is likely if variations in contact between shaft and bearing take place. Therefore, according to my invention, if a tubular shield, coaxial with the condenser shaft, is made sufficiently heavy, it can function as shield and extended bearing support. It is quite necessary that it be well grounded and fastened to the chassis for support.

A further improvement is to be had with my improved invention in that different degrees of capacity ranges within the limits of the condenser may be quickly and easily had by a stop-collar having adjustable securing means.

This invention will best be understood by referring to the accompanying drawings, wherein.

Figures 1, 2, 3, 4:
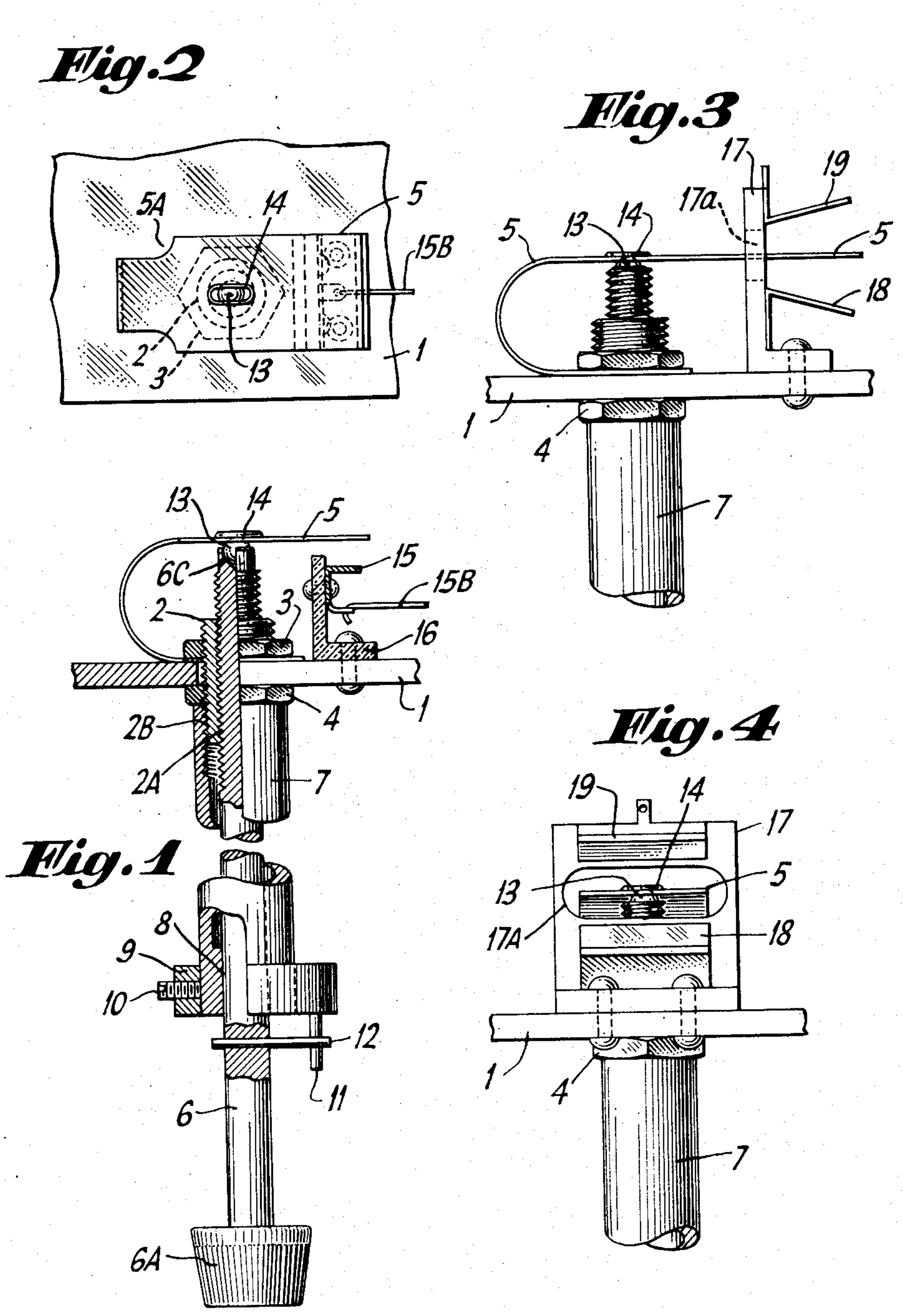
Fig. 1 is a longitudinal elevation, partly in section, of the condenser of this invention.
Fig. 2 is an end elevational view of the condenser of Fig. 1.
Fig. 3 is a longitudinal elevation of a modification of Figs. 1, 2.
Fig. 4 is a side elevation of Fig. 3.

Referring now to the drawings, the condenser unit is mounted through an aperture in a metal mounting plate 1, which plate may be a panel or a radio transmitter chassis. A threaded bushing 2 (which has internal threads 2A and external threads 2B) is inserted in the aperture of panel 1. Bushing 2 is held in place by means of nuts 3 and 4 threaded on the externally threaded portion 2B. Threaded nut 3 also holds in place an adjustable U-shaped spring condenser plate 5. The knob end of condenser shaft 6 is supported and shielded by bearing extension tube 7 secured to bushing 2, which tube carries the shaft bearing 8 at its extreme end. Mounted upon the extreme end of bearing extension tube 7 is a collar 9 which is held to the bearing extension by means of a set screw 10. The collar 9 also carries a collar stop 11, which limits the rotation of the shaft 6 by contacting the shaft stop pin 12. An insulating knob 6A is secured to shaft 6 by any suitable means. The opposite end of shaft 6 is threaded so as to fit the internally threaded portion 2A of bushing 2. The threaded end of shaft 6 is also provided with a semi-circular aperture 6C, in the tip of which is placed a polished steel ball 13 which is retained by having the tip end of shaft 6 rolled over. Ball 13 rides in a depression 14 of the adjustable condenser plate 5. A fixed condenser plate 15 is held to the mounting plate 1 by means of a ceramic or any other suitable insulating mounting bracket 16. This insulating bracket is arranged to protrude slightly beyond the fixed plate 15, for a distance which is sufficient to prevent a short circuit between the fixed plate 15 and the adjustable plate 5 when the shaft 6 is retracted in its forward or maximum capacitive position. A terminal lead 15B is provided to make connection to fixed plate 15.

If the congruous threads of shaft 6 and bushing 2 are made right handed, then the capacity of the condenser will decrease with right hand rotation of the tuning knob 6A. If the same threads are made left hand, then the reverse will be true; the condenser will have an increasing capacity with a right hand dial rotation.

Referring now to Figs. 3 and 4 of the drawing which is a modification showing a condenser having two plates each insulated from ground and a common "rotor" or adjustable plate in between. A condenser of this type may be used as a phasing control or many other functions wherein two separate stator plates are required that function 180° out of phase. The stator plates 18 and 19 are mounted upon an insulated bracket 17. An elongated hole or opening 17A is provided in bracket 17 to permit the adjustable plate 5 to pass through and come within capacitive relationship to stator plates 18 and 19. The width of opening 17A is made of such magnitude as to limit the motion of adjustable plate 5 before contacting stator plates 17 and 18, thereby preventing a short circuit. The double stator plate construction limits the capacity range selection to one position, otherwise the details of construction and performance is similar to the single stator plate type shown in Fig. 2.

In the operation of this device, when the shaft 6 is moved backward toward the maximum capacitive position where plate 5 almost touches bracket 16, the collar 9 which carries stop pin 11 is adjusted in its position by set screw 10 so as to prevent further backward rotation of shaft 6. The condenser is then adjusted for its maximum capacity position and the shaft will then be permitted to make almost 360° rotation in the forward or minimum capacitive direction, which will cause the shaft to move in a position such as to force the variable plate or electrode 5 away from electrode 15 and thereby decrease the condenser capacity. If the capacity range in the maximum position covered by the above mentioned setting is too great, the stop collar 9 may be loosened and adjusted to a new position compelling the shaft 6 to work over a different range, which in turn causes spring plate 5 to work over a range having a greater plate separation. Hence, there will be reduced value of capacity and likewise a reduced capacity range. This adjusting process may be continued to lower values within the range of condenser construction. The area of plate 5 is reduced at 5A to permit more flexibility. Also, if desired, the area of both plates may be increased in both width and length to cover other tuning ranges by its increased active capacitive area.

What is claimed is:

1. A high frequency vernier tuning condenser comprising a metallic panel, a threaded bushing secured intermediate its ends to said panel, an insulating support member having a slot, said insulating support member secured to one side of said panel and spaced from said bushing, a pair of fixed metallic electrodes secured to the insulating support member on opposite sides of the slot, a U-shaped movable electrode secured at one open end to said panel, the other open end of said movable electrode extending through the slot in said insulating support member and positioned between and in capacitive relationship with said fixed electrodes, a tubular member secured to said bushing on the other side of said panel, a rotatable shaft coaxially arranged within said tubular member and extending beyond one end of said bushing, and extending beyond the tubular member at the other side of said panel, and a first stop member on said shaft intermediate the end of said extension portion and said knob, a second stop member on said extension portion, for engaging the first stop member and arranged to permit approximately 360° rotation of said movable shaft.

2. A high frequency condenser including an internally threaded bushing fastened to a support, a fixed electrode insulatingly secured to said support adjacent said bushing, a movable electrode secured to said support so that a capacitive relation may exist between the two electrodes, an operating shaft threaded through said bushing and having one end touching said movable electrode whereby upon rotation of said shaft the spacing between said electrodes is altered, a control knob on the opposite end of said shaft, a tubular shield surrounding said shaft between said bushing and said knob, shaft bearing means in said shield at the end nearest the knob whereby a supporting surface is provided for said shaft.

3. The variable high frequency tuning condenser comprising a panel, a fixed electrode insulatingly supported by said panel, a movable spring-like electrode secured to said panel and in capacitive relation to said fixed electrode, a threaded bushing secured intermediate its ends to said panel, a tubular shield attached to said bushing at one end and extending perpendicularly from said panel on the side opposite said electrodes, a rotatable shaft within said shield and threadedly engaging the bushing and having one end touching said movable electrode for moving the movable electrode relative to the fixed electrode, bearing means in the unattached end of said shield to provide support for said shaft and means on the end of said shaft beyond the unattached end of said shield to rotate said shaft.

HAROLD A. MOORE.

REFERENCES CITED

The following references are of record in the file of this patent:

UNITED STATES PATENTS

| Number | Name | Date |
|---|---|---|
| 2,143,658 | Morris | Jan. 10, 1939 |
| 2,261,879 | Higgins | Nov. 4, 1941 |
| 2,281,147 | Franklin | Apr. 28, 1942 |

FOREIGN PATENTS

| Number | Country | Date |
|---|---|---|
| 235,279 | Great Britain | June 8, 1925 |